United States Patent [19]
Weisenburger

[11] 3,960,423
[45] June 1, 1976

[54] MULTI-CONTACT CONNECTOR FOR SUBSTRATE-TO-BOARD CONNECTIONS

[75] Inventor: Lawrence Paul Weisenburger, Winston-Salem, N.C.

[73] Assignee: AMP Incorporated, Harrisburg, Pa.

[22] Filed: Oct. 2, 1974

[21] Appl. No.: 511,881

[52] U.S. Cl. .................. 339/17 CF; 339/17 M; 339/59 M
[51] Int. Cl.² ......................................... H05K 1/12
[58] Field of Search ......... 339/17 C, 17 CF, 17 LM, 339/17 M, 19, 59, 4

[56] References Cited
UNITED STATES PATENTS

| | | | |
|---|---|---|---|
| 3,319,216 | 5/1967 | McCullough | 339/59 M X |
| 3,362,005 | 1/1968 | Corns | 339/4 |
| 3,551,750 | 12/1970 | Sterling | 339/17 LM |
| 3,757,271 | 9/1973 | Judge et al. | 339/17 CF |
| 3,760,330 | 9/1973 | Bennett et al. | 339/17 LM X |
| 3,795,884 | 3/1974 | Kotaka | 339/17 LM |
| 3,806,767 | 4/1974 | Lehrfeld | 339/19 X |
| 3,831,131 | 8/1974 | Woodcock et al. | 339/17 CF X |
| 3,858,958 | 1/1975 | Davis | 339/17 LM |

OTHER PUBLICATIONS
V. Bresg; "Spring Contact"; IBM Technical Disclosure Bulletin, vol. 10, No. 4; Sept. 1967; p. 363.

J. P. G. Dunman; "Printed Circuit Connector"; IBM Technical Disclosure Bulletin, vol. 7, No. 3; Aug., 1964, p. 182.

*Primary Examiner*—Joseph H. McGlynn
*Assistant Examiner*—Craig R. Feinberg
*Attorney, Agent, or Firm*—Robert W. Pitts; Frederick W. Raring; Jay L. Seitchik

[57] ABSTRACT

Multi-contact electrical connector for connecting terminal pads on one panel-like member to terminal pads on another panel-like member comprises a generally U-shaped contact terminal strip. The strip is made up of a strip of thin plastic having spaced-apart spring metal contact terminals adhered to one external surface thereof. The edges of the strip are mounted on an elongated mounting bar of insulating material. The connector is located between the panel-like members with the spring contacts in alignment with corresponding terminal pads. The panel-like members are clamped in a pre-determined relationship so that the terminals are flexed and portions of the terminals on opposite sides of the strip are resiliently urged against the pads.

17 Claims, 13 Drawing Figures

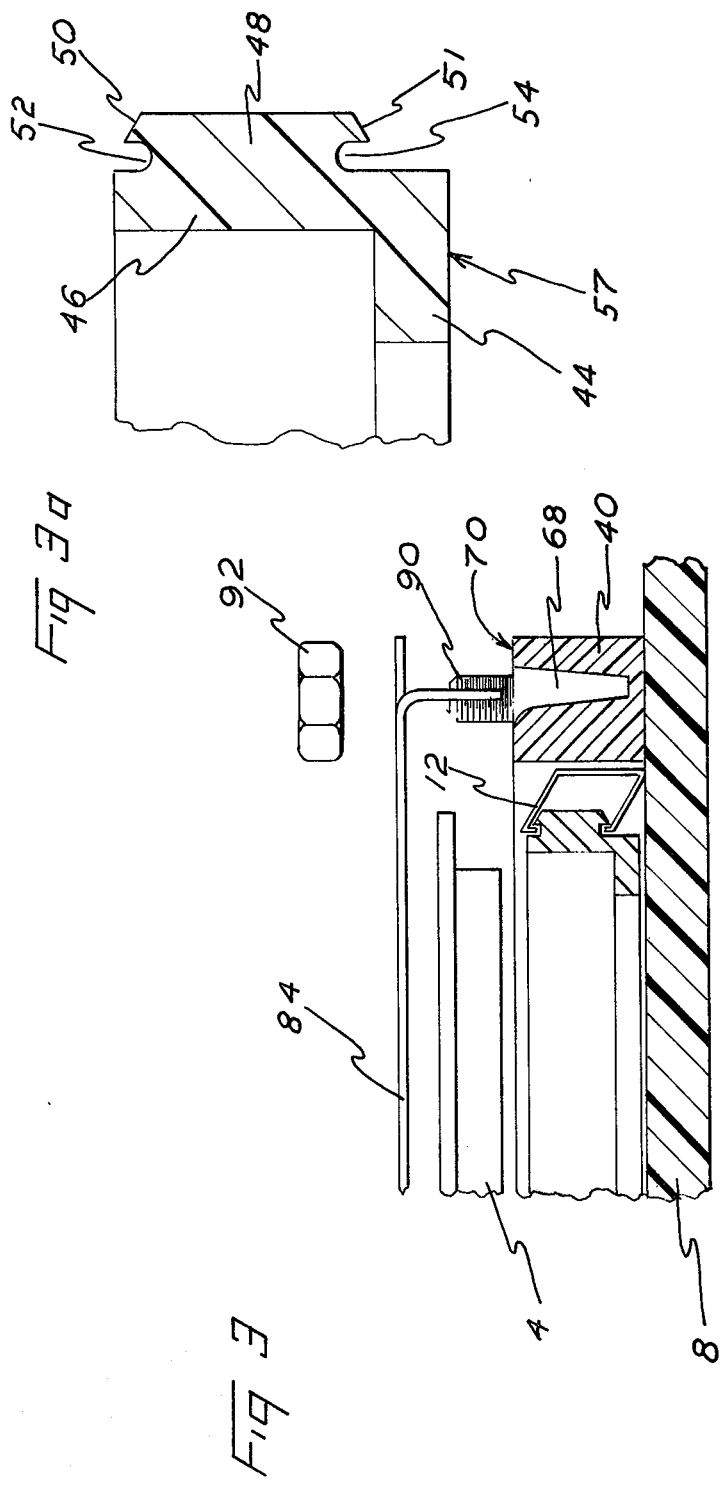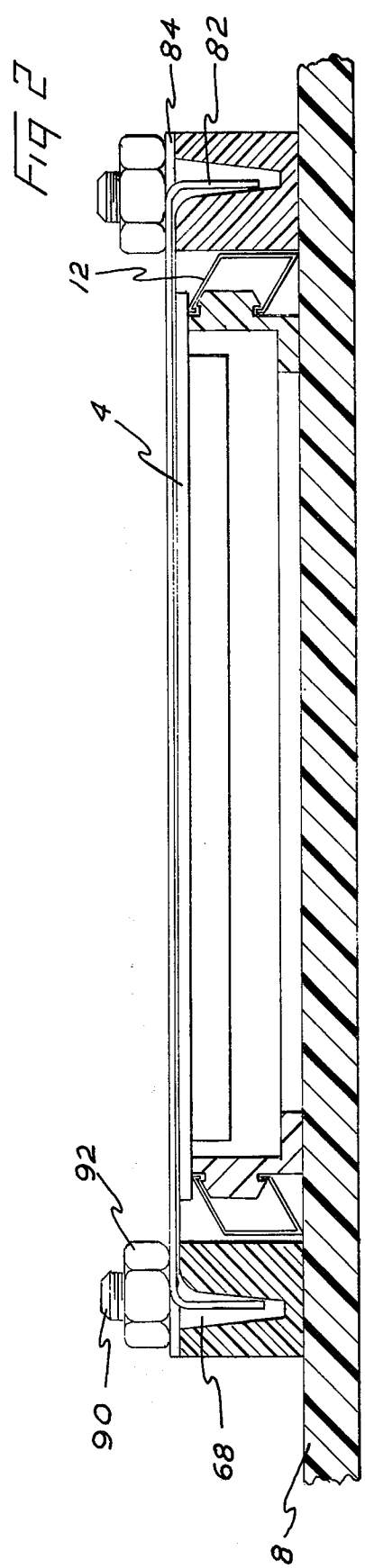

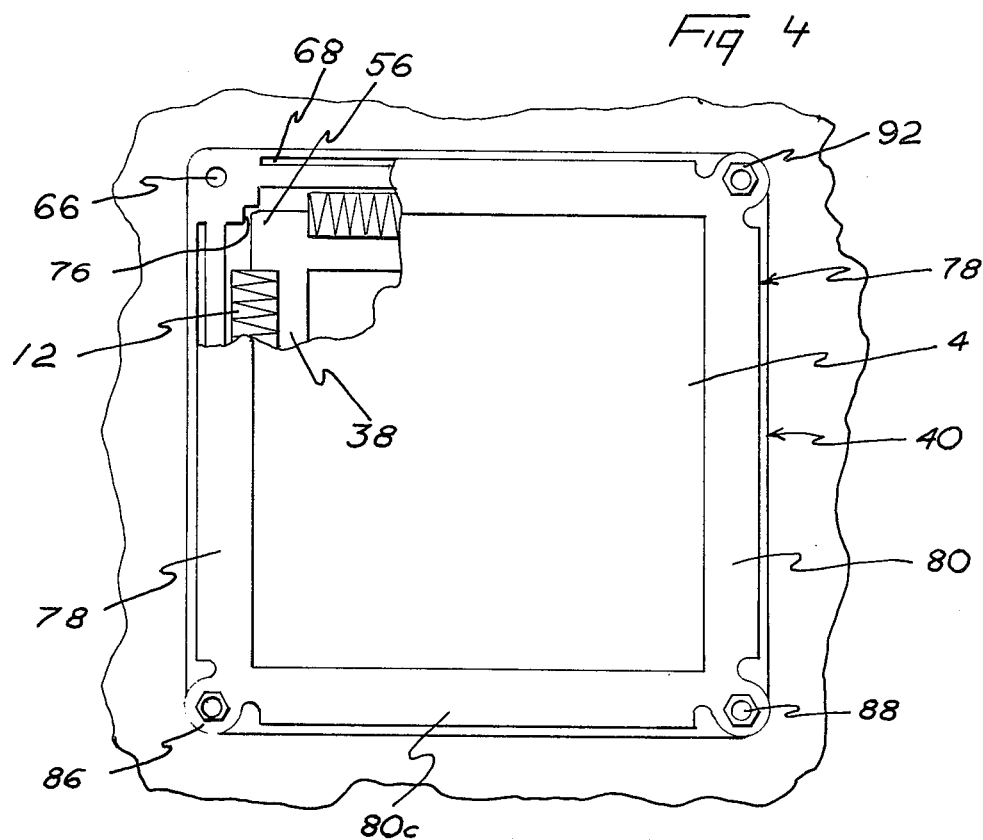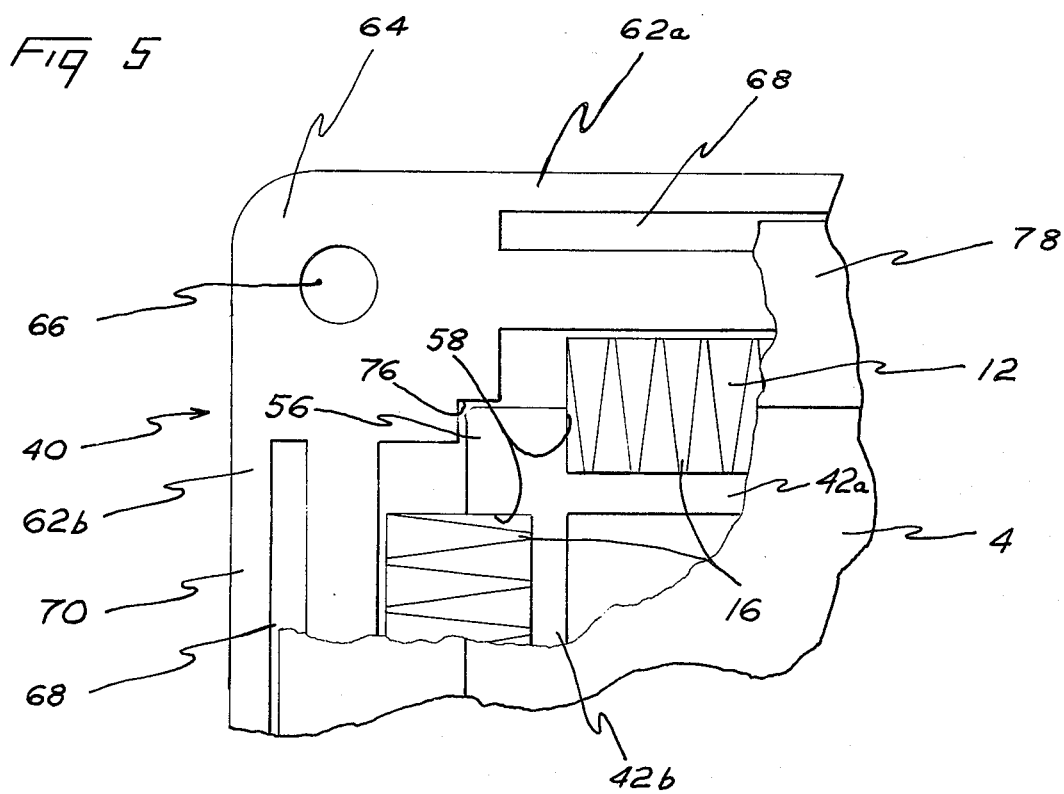

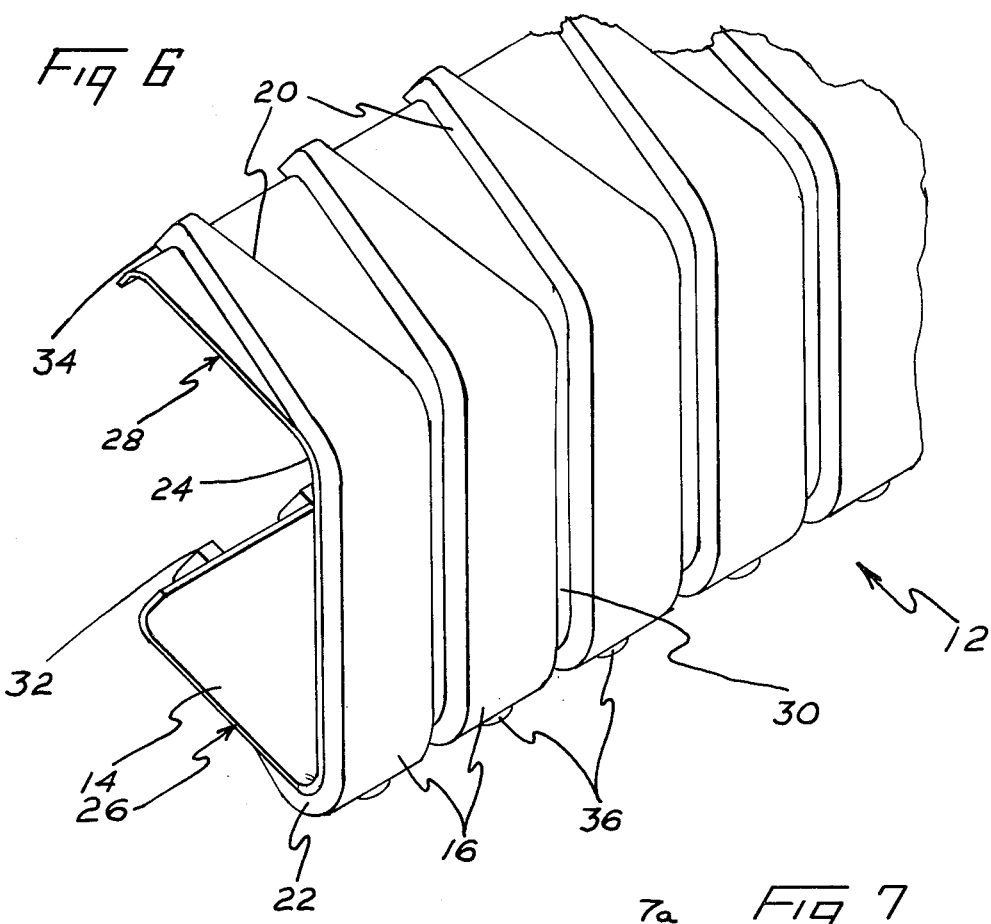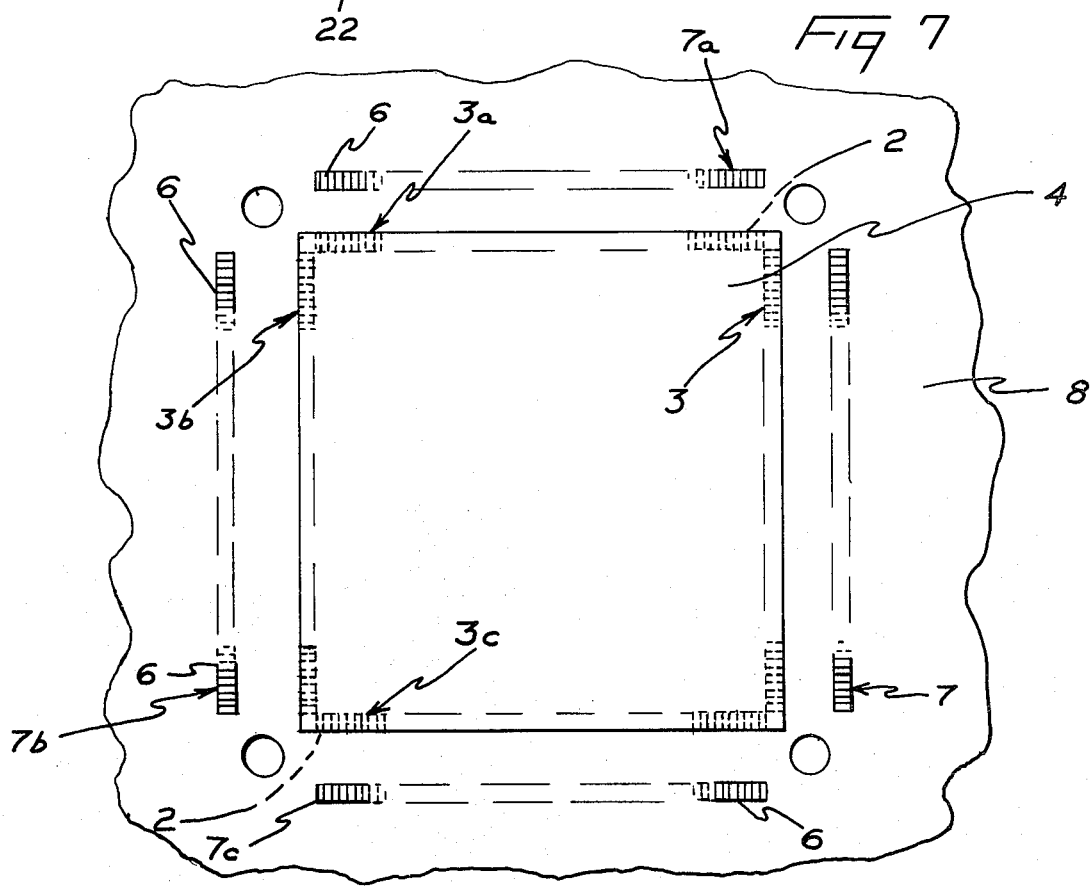

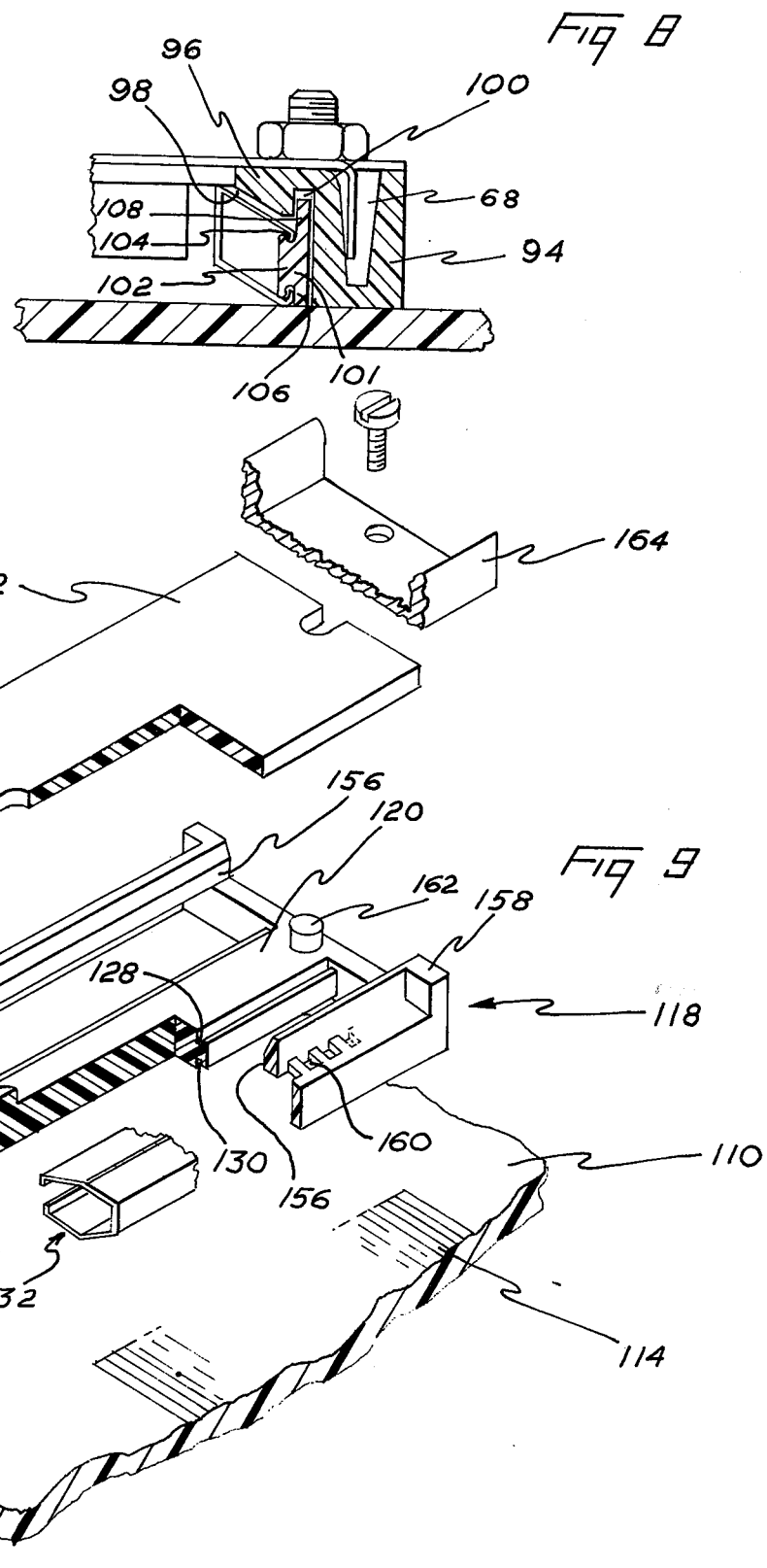

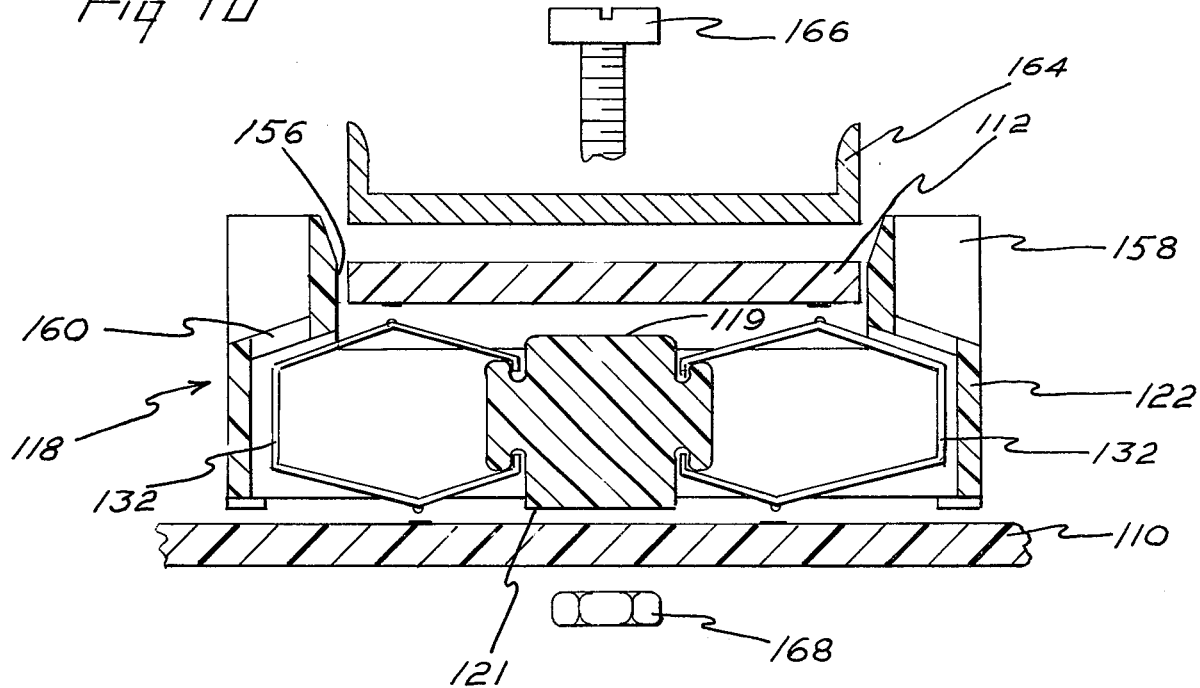
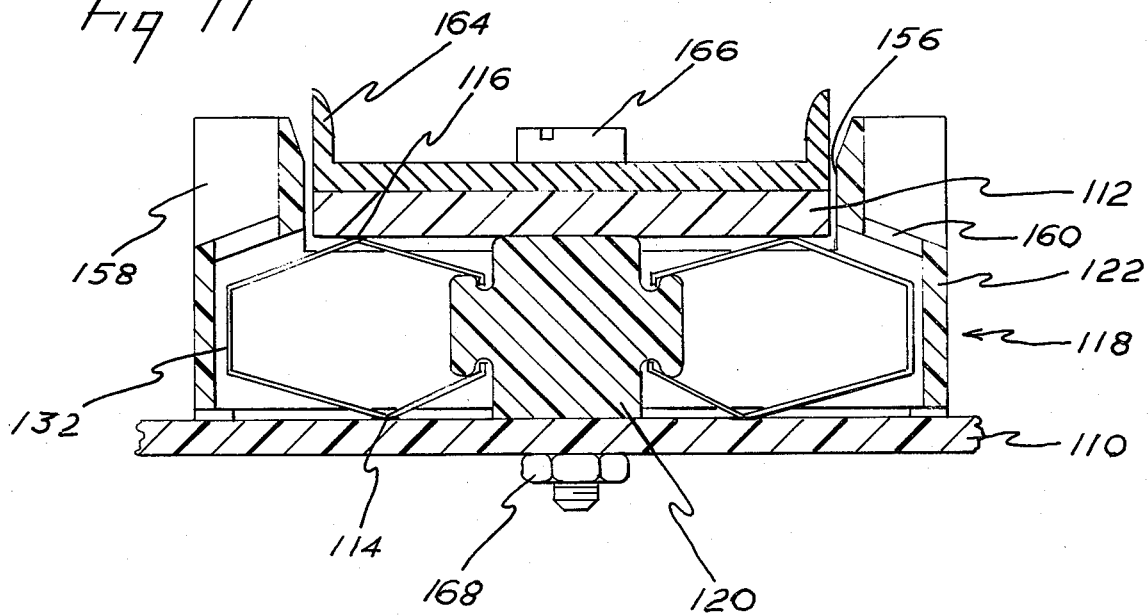

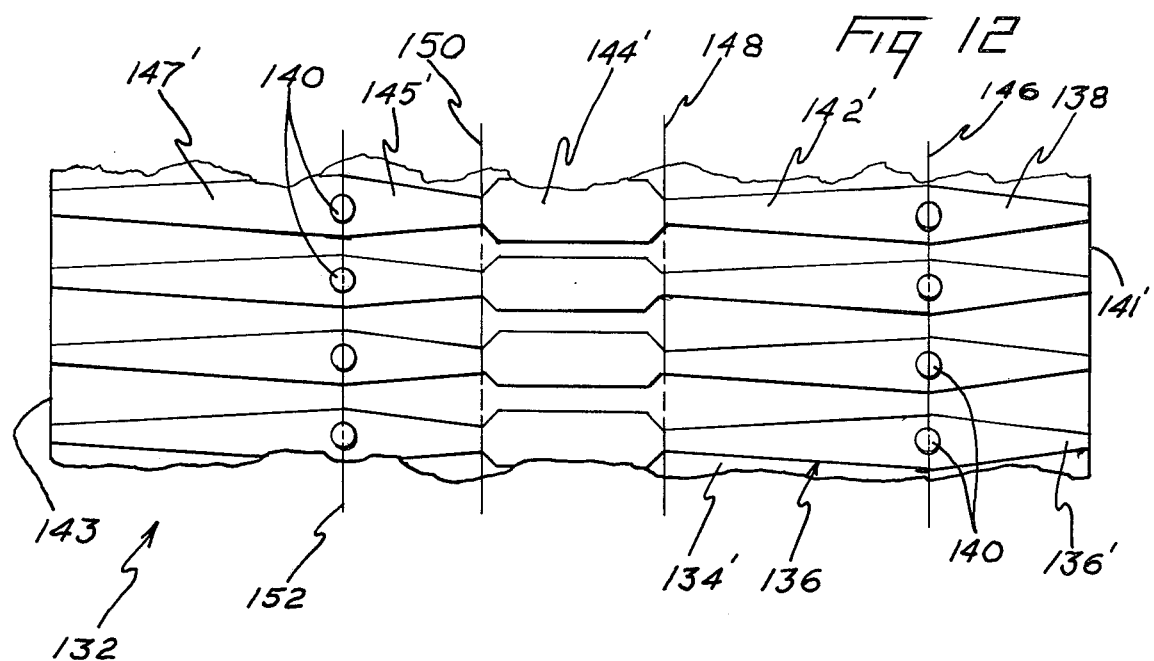

MULTI-CONTACT CONNECTOR FOR SUBSTRATE-TO-BOARD CONNECTIONS

BACKGROUND OF THE INVENTION

This invention relates to a multi-contact electrical connector for connecting terminal pads or areas on one panel-like member to the terminal pads on the second panel-like member. The particular embodiments disclosed herein are specifically intended to connect the terminal pads which are located along the sides of a substrate to terminal pads on a printed circuit board, however, many other applications of the principles of the invention will be apparent to those skilled in the art of electronic packaging and interconnections.

The wide-spread and increasing use of solid state electronic devices and the complexity of the circuits in which they are used continues to give rise to the need for new types of electrical connecting devices for forming connections between panel-like surfaces such as the terminal pads on a substrate and the terminal pads of the connectors on a printed circuit board. New problems related to such interconnections continue to arise and quite often, the available interconnection systems are incapable of performing the interconnection functions which are required. For example, a wide variety of printed circuit board connectors are available which comprise a housing or a mounting member of insulating material and individual spring contacts which are mounted in, or on, the insulating mounting member. Multi-contact connectors of this type can be scaled down from the relatively coarse sizes of pre-solid state circuitry but there is a point beyond which such scaling down of pre-existing designs becomes impractical if not impossible.

A further problem which faces the electronic art is that solid-state electronic devices are manufactured in a wide variety of configurations, terminal pad locations, terminal pad spacings, and other variables so that specialized connecting devices are frequently required for a particular electronic package. In other words, the electronic packaging art is developing in a way which does not permit the wide spread use of standard types of electrical connectors. Since the manufacturing cost of an electrical connector is directly related to the volume of production and connectors which are not manufactured in extremely high volumes tend to be high priced, the achievement of low cost connectors becomes difficult.

The instant invention is directed to the achievement of a multi-contact electrical connector for parallel spaced apart panel-like members, such as a substrate and a printed circuit board, which can be produced in relatively small sizes at a low cost and in a wide variety of specific configurations for specific packaging requirements. The invention is further directed to the achievement of a connector of small size which will provide a high contact pressure at each contact point so that, if desired, the common expedient of using gold plated contact terminal pads and terminals can be avoided.

It is accordingly an object of the invention to provide an improved multi-contact electrical connector. A further object is to provide a multi-contact electrical connector for forming connections between parallel spaced apart and laterally offset rows of terminal pads on two parallel panel-like members. A further object is to provide a connector of small size which can be manufactured at low cost and which will produce a relatively high contact pressure. A still further object is to provide a relatively small electrical connector for closely spaced terminal pads which can be economically manufactured and which does not require extremely close dimensional tolerances for all of its parts.

These and other objects of the invention are achieved in preferred embodiments thereof which are briefly described in the foregoing abstract, which are described in detail below, and which are shown in the accompanying drawing in which:

FIG. 2 is a cross-sectional view of a connector assembly in accordance with the invention mounted on a printed circuit board, this view being taken along the lines 2—2 of FIG. 4.

FIG. 3 is a fragmentary view, similar to FIG. 2, with the substrate and the clamping member exploded from the connector assembly.

FIG. 3A is an enlarged fragmentary view of the bar-like supporting member.

FIG. 4 is a plan view of the connector assembly with corner portions thereof broken away.

FIG. 5 is a fragmentary enlarged view of the connector assembly.

FIG. 6 is a fragmentary view, on a greatly enlarged scale, of a portion of a contact terminal strip which forms a part of the connector.

FIG. 7 is a plan view of a substrate and a portion of a printed circuit board showing the positions of the terminal pads which are connected to each other by the connector.

FIG. 8 is a view similar to FIG. 2 of an alternative embodiment.

FIG. 9 is a perspective exploded view of a further embodiment specifically intended for forming connections between a substrate and a printed circuit board where the terminal pads the substrate and the circuit board are arranged in two parallel spaced apart rows but with the rows on the circuit-board offset from the rows on the substrates.

FIG. 10 is a cross-sectional view of the embodiment of FIG. 9 showing the positions of the parts prior to clamping the substrate with relationship to a printed circuit board.

FIG. 11 is a cross-sectional view similar to FIG. 10 but with the parts fully assembled.

FIG. 12 is a plan view of the terminal strip prior to forming into the shape shown in FIGS. 9–11.

Figure 1:
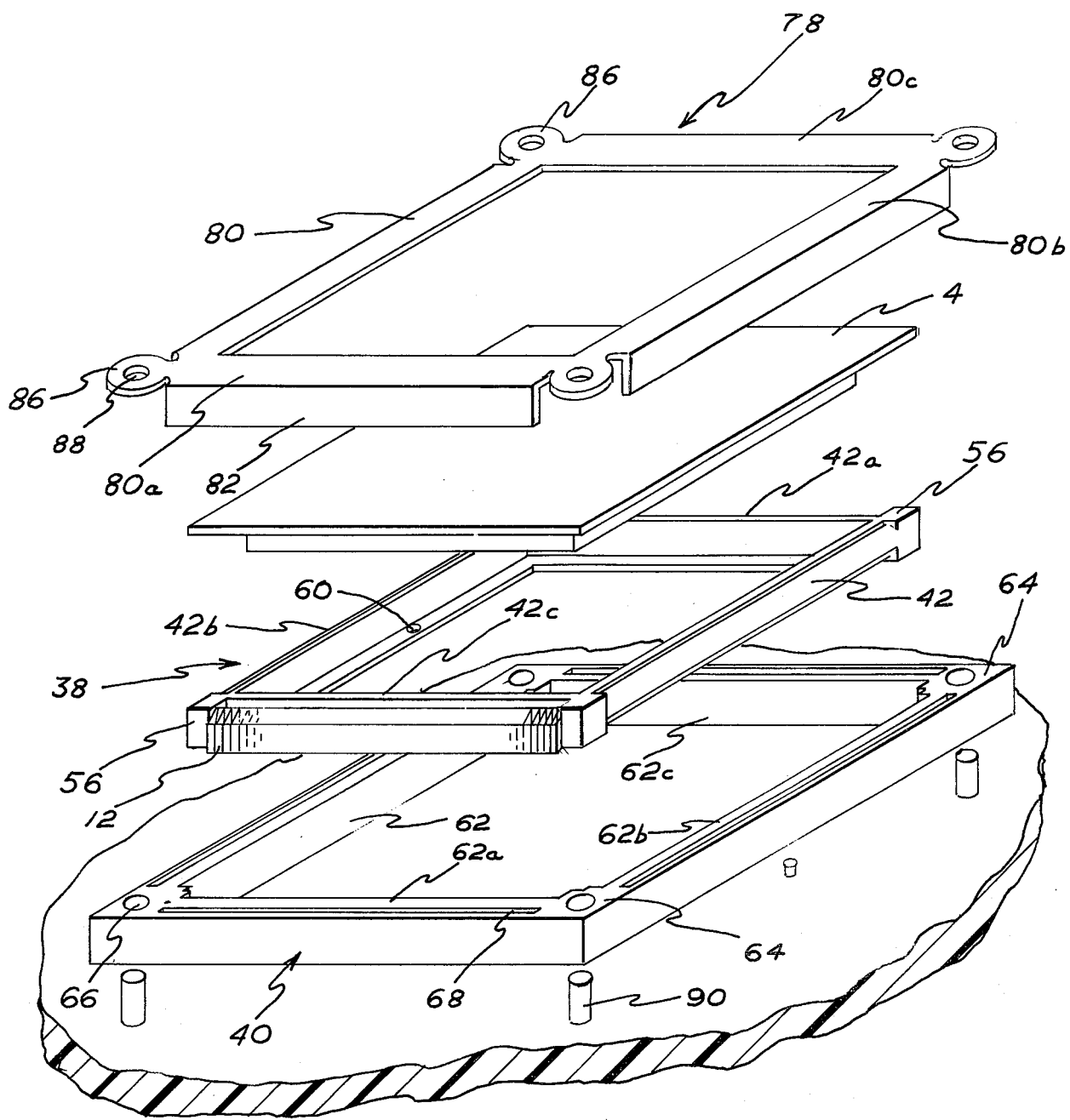
FIG. 1 is a perspective view of a portion of a printed circuit board and an electrical connector assembly in accordance with the invention, the several parts of the connector being exploded from the board and from each other to reveal structural details.

Referring first to FIG. 7, the disclosed embodiment of the invention serves to connect terminal pads 2 on the underside of a substrate 4 to terminal pads 6 on the upper surface, as viewed in the drawing of a printed circuit board or the like 8. The terminal pads 2 are arranged in four rows 3, 3a, 3b, and 3c, each row extending along one side of the substantially square substrate. The terminal pads 6 are similarly arranged in rows 7, 7a, 7b, and 7c which form a square on the surface of the printed circuit board 8. The rows 7–7c are laterally offset from the rows 3–3c but the rows on the substrate and the printed circuit board are parallel to each other and contain the same number of terminal pads.

It will be understood that the substrate 4 may have mounted thereon an integrated circuit chip, a hybrid electronic circuit, or any similar device and that the terminal areas 6 are on the ends of conductors which may extend to other integrated circuit devices on the printed circuit board 7 or to terminal posts mounted in the printed circuit board. It will also be apparent from a review of the drawings that the structural features of the four sides of the connector described below are substantially identical. Accordingly, only the righthand side of the connector, which funtions to connect the terminal pads in the row 3 to the terminal pads in the row 7, will be described in detail.

The electrical connections between the pads 2 and 6 are made by an elongated strip 12 which comprises a continuous strip of thin polymeric film 14 on one surface of which there are provided a plurality of spaced apart flat conductors 16 which extend between the side edges of the film 14. The number of conductors 16, and the space between the center lines of adjacent conductors is the same as the number of terminal pads in the rows 2 and the spacing between adjacent pads so that one conductor is provided for each pair of corresponding terminal pads. The contact terminal strip 12 is manufactured by first providing a flat strip of film having flat conductors thereon and this may be done by bonding individual conductors 16 to the film 14 or by laminating a foil to the film and selectively etching the foil so that the conductors remain. The flat strip is then reversely formed through an angle of substantially 180° with respect to an axis extending parallel to the length of the strip and on the surface thereof which is opposite to the surface on which the conductors 16 are located. In the embodiment of FIG. 1, the conductors are bent along two parallel bend lines 22, 24 in a manner such that the strip has the appearance of a parallegram in cross-section, the sidewall 26 of the parallegram subtending an acute angle with the web 30 and the sidewall 28 subtending an obtuse angle with the web. The free ends of the conductors are bent inwardly towards each other as shown at 32, and 34 and each conductor is advantageously provided with a contact boss 36 at the intersection of sidewall 26 and web 30.

Connectors in accordance with the invention can be made in any desired size and one practical application is intended for terminal pads on 0.050 centers. The film for a connector of this type may be extremely thin, for example, 0.001, while the conductors 16 should be relatively thick if high contact pressure is desired, for example, 0.007 and should be a metal having good spring characteristics such as phosphor bronze or beryllium copper. It will be noted that the central portion of each conductor 18 which extends across the web 30 is relatively wide while the portions which extend across the sidewalls 26, 28 are tapered towards their ends as shown at 20. This feature assists in achieving a preferred deflection mode as will be described below.

The plastic film 14 of this embodiment does not contribute significantly to the behavior of the connector strip but functions only to hold the conductors 16 in parallel spaced apart relationship as fully described in application Ser. No. 486291 filed July 8, 1974 and the film is, therefore, fully compliant to the conductors 16.

The connector assembly, FIG. 1, comprises four connector strips 12 mounted on a mounting frame 38 which is disposed within a confining frame 40 which in turn is on the printed circuit board 8. The supporting frame 38 comprises a square open frame member of suitable plastic insulating material, such as glass filled nylon, having sides 42, 42a, 42b, and 42c and having corners 56. As viewed in cross section, each side is substantially L-shaped having a horizontally extending base 44 and an upwardly extending wall or flange 46. Wall 46 has an outwardly directed rib 48 extending for the full length of each side having upper and lower inclined sides 50, 51. The sides 50, 51 merge with grooves or channels 52, 54 and the dimensions of the rib are such that the connector strip 12 can be assembled to the rib as shown, with the inwardly turned ends 32, 34 disposed in the grooves 52, 54. As also shown, the edges of the sidewalls are substantially bottomed in the grooves when the strip is assembled to the rib 48.

Each corner 56 of the mounting frame 38 is enlarged and the ribs 48 stop short of the corners so as to provide shoulders 58 (FIG. 5) extending outwardly beyond the ribs. The opposed shoulders 58 on each side 42–42c thus serve to confine each connector strip 12 against movement along the rib on which it is mounted. As will be explained below, the corners 56 also function to locate the supporting frame 38 within the confining frame or mounting frame 40. The supporting frame 38 is located by locating pins on the printed circuit board which extend through locating holes 60 in the base portions 44 of two opposed sides 46 of the supporting frame. Finally, and as shown in FIG. 3 it will be noted that the location of the downwardly facing surface 57 of the supporting frame 38 with respect to the rib 48 and the recesses 52, 54 is such that when connector strips 12 are mounted on all four sides of the supporting frame, and the frame is positioned on the upper surface of the printed circuit board 8, the connector frame is supported above the surface of the printed circuit board by the connector strips which engage the surface of the board at the lower most corners 22 thereof which we defined by the bends 22.

The confining frame 40 is also of suitable plastic such as glass-filled nylon and is again, an open rectangular member having sides 62, 62a, 62b, 62c and corners 64. The sides 62–62c are generally rectangular in cross-section and each side has a deep groove 68 extending thereacross inwardly from its upper surface 70, these grooves ending short of the corners 64 as shown in FIG. 5. The corners 64 are provided with bolt holes 66 and each corner has shoulders 72 which extend normally with respect to the sides 62 and face towards the adjacent corners. The corners are notched as shown at 76, between the shoulders 72 the notches of opposite corners being directed towards each other and the distance between opposed notches 76 is slightly greater than the diagonal dimension of the supporting frame 38 so that the supporting frame can be centrally located within the combining frame 40 as shown in FIG. 5.

The final element of the connector assembly comprises a clamping or hold down frame 78 which has four sides 80, 80a, 80b, 80c and corners 86. The sides are of flat sheet metal as shown at 84 (FIG. 2) and each side has a depending flange 82 on its outer edge. The corners 86 have bolt holes 88 so that when the hold down frame is positioned on the upper surface of the combining frame, the flanges 82 will extend into the grooves or recesses 68 and the upper flat surface 84 of the frame 78 will project over the upper surface of the substrate 4.

In use, the supporting frame 38 with the connector strips 12 mounted thereon is first positioned on the upper surface of the printed circuit board with suitable guide pins extending through the guide holes 60 to locate the supporting frame accordingly. As previously mentioned, the frame will be held above the surface of the printed circuit board by the connector strips 8 as shown, in FIG. 3. Thereafter, the substrate 4 is positioned on the upper side of the supporting frame 38 with the rows of terminal pads 3 in registry with the conductors on the terminal strips 12. The confining frame 40 and the clamping frame are then mounted on the upper surface of the printed circuit board with the mounting bolts 90 extending from the printed circuit board through the mounting holes 66 and 88 of the confining frame 40 and the clamping frame 78 respectfully. Nuts 92 are then threaded onto the bolts and the substrate 4 is pressed downwardly against the upper side of the supporting frame until the lower surfaces 57 of the supporting frame bottoms against the upper surface of the printed circuit board 8. The individual connector strips will be resiliently deformed during this bolting down process and the corners defined by the bend lines 22 and by the inwardly turned ends 34 of the sidewalls 28 will be resiliently urged against the terminal pads and the terminal areas of the substrate and the printed circuit board respectfully.

It should be noted that the supporting frame functions as the fourth side of a parallegram, three sides of which are comprised of the three sides of the connector strip 12 so that when the parts are assembled completely, each of the connector strips is stressed in the manner of a parallepiped with oppositely directed forces imposed upon two opposed edges of the parallelpiped. The tapered shape of the portions 20 of each conductor evenly distributes the stresses along these portions of the conductors and encourages them to deflect relative to the web portion 30 with a uniform curvature along their lengths on the sidewalls.

FIG. 8 shows an alternative embodiment of the invention in which the confining frame 94 has an inwardly directed flange 96 which has an inclined underside 98 merging with an upwardly extending groove or channel 100. Each of the four sides of the connector assembly is of the same construction as that shown in FIGS. 1–7 and it will be understood that this embodiment is intended for connecting the same arrangement of terminal pads as the embodiment of FIG. 1. The mounting frame 101 for the strips 12 in this instance comprises a rectangular bar having an upper portion which is adapted to fit into the recess 100. The frame also has an inwardly directed rib 102 which is recessed on its upper and lower sides for reception of the inwardly edge portions 32, 34 of the connector strip. As in the previous embodiment, opposed corners of a connector strip are engaged with the terminal pads and terminal areas and the terminal strip is stressed in the same manner as previously described. This embodiment differs from the previously described embodiment in that a single connector strip 12 can be mounted on a single supporting frame 101 which in turn would be supported by a single combining frame 94. The previously described embodiment must have at least two opposed connector strips 12 in order to hold the supporting frame against the surface of the printed circuit board.

FIGS. 9–12 show a further embodiment of the invention for connecting two parallel rows of terminal pads 116 on a substrate 112 to two rows of pads 114 on a printed circuit board 110. This embodiment comprises a frame 118 of molded insulating material having a central bar-like body section 120, side sections or side rails 122, and end members 124 which extend between the central body and the side rails. Mounting ribs 126 extend laterally from opposite sides of the central member 120 and each rib has a groove 128 on its upwardly facing surface and a groove 130 on its downwardly facing surface.

The contact terminal strip is shown in FIG. 12 prior to forming, the parts of the strip being identified by primed reference numerals. The strip 132' comprises a thin strip of film 134 having transversely extending conductors 136 thereon. These conductors are of conductive spring material as previously described and may be substantially thicker than the film 134. Each conductor has a tapered portion 138' extending inwardly from the edge 144' of increasing width, then has a portion of decreasing width 142' which extends to a central portion 144' of uniform width. A section of increasing width 145' and a section of decreasing width 147' extend from the central uniform width portion to the lefthand edge 143'. Contact embossments 140 are provided for engagement with the terminal pads as shown in FIG. 11. The strip shown in FIG. 12 is bent along bend lines indicated at 146, 148, 150 and 152 to impart the cross-sectional shape shown in FIG. 10. The formed connector strip is thus substantially U-shaped although the sidewalls are not parallel to each other, each sidewall extending outwardly so that the contact bosses are spaced apart in a vertical direction by a distance which is greater than the distance between the faces 119, 121 of the central portion 120 of the housing. The edges 141, 143 are inwardly formed and the degree to which the conductors are bent along the bend lines is such that these edges will seat snugly in the recesses 128, 130. Advantageously, supports 123 are provided on the side rails 122. The surfaces of these feet are co-planer with face 122 to prevent stabilizing the frame on the board 110.

The side rails 122 are spaced from the terminal strips and each side rail has an inwardly displaced wall section 156, and end walls 158, spaced apart openings 160 are provided between the end walls 158 to admit a test probe to each of the conductors. The frame 118 is located on the printed circuit board 110 by suitable mounting pins 162 which extend through the central member 120 at the ends thereof.

The clamping means for clamping the connector comprises a channel member 164 which has a width such that it fits between walls 156 and a length such that its ends extend beyond the substrate. Clamping screws 166 extend through holes adjacent to the rods of the channel and through aligned holes in the printed circuit board 110. Nuts 168 are threaded onto the lower ends of these screws as shown in FIG. 11 to retain the substrate and the circuit board clamped against the oppositely facing surfaces 119, 121 of the central rib-like body section 120. The channel member may be of metal since it bears against the upper surface of the substrate and, if of metal, it will serve the added function of dissipating heat from the substrate.

In use, the connector is placed on the printed circuit board with locating pins 162 extending into openings in the board as shown in FIG. 10. The substrate 112 is then positioned between the walls 156 and the frame 118 is then clamped by clamping means 164 between the printed circuit board and the substrate. As with the previous embodiments, the contact terminals are resiliently deformed and urged and engagement with the terminal pads. It should be noted in this embodiment that the stresses developed in the connector strip are transmitted to the central member 120 of the frame.

A significant feature of the embodiments of the invention disclosed herein is that portions of the sidewalls extend above or below the oppositely directed faces of the supporting bar for the strip and the upper surface or face of this supporting bar serves as a stop for the substrate while the lower surface is bottomed on the printed circuit board. This relationship is illustrated in FIGS. 10 and 11; the upper contact embossment 140 is above the level of the upper surface of member 120 in FIG. 10 but when the parts are fully assembled, FIG. 11, the substrate is supported on this upper surface and the connector strip is flexed so that the contact pressure is developed. A similar relationship in the embodiment of FIG. 1 is illustrated by FIGS. 2 and 3.

A wide variety of connectors for different specific applications can be made in accordance with the general teachings of the invention. For example, by bending the strip of FIG. 12 and forming the contacts of the appropriate shape offset or aligned terminal pads on the substrate and on the PC board can be connected to each other. The clamping means can take a wide variety of forms, for example, the central bar member 120 can be directly clamped to the printed circuit board if desired.

What is claimed is:

1. A multi-contact electrical connector for connecting corresponding terminal pads on a first panel-like member to terminal pads on a second panel-like member, said second panel-like member extending parallel to said first panel-like member, said connector comprising:
   a contact terminal strip, said terminal strip comprising an elongated strip of relatively thin insulating film and a plurality of conductors of resilient spring metal adhered to said film, said conductors extending in parallel side-by-side relationship across said strip,
   said conductors being reversely formed with respect to the axis of said film through an angle of substantially 180° with said conductors on the external surface thereof, each of said conductors constituting a resilient conductor spring, each of said conductors having first and second contact zones on said external surface and intermediate the ends of said conductors, said first and second contact zones facing in opposite directions for engagement with corresponding terminal pads on said first and second panel-like members,
   insulating supporting means, said supporting means having parallel oppositely directed faces for supporting said first and second panel-like members in fixed spaced-apart relation,
   said contact terminal strip being mounted on said insulating supporting means between said parallel oppositely directed faces with the planes defined by said oppositely directed faces normally extending between said first and second contact zones, whereby
upon mounting said first and second panel-like members on said parallel oppositely directed faces, said terminal pads initially engage said first and second contact zones and force said first and second contact zones towards each other thereby flexing said resilient spring metal conductors and generating sufficient contact force between said terminal pads and said contact zones to form an electrical connection between corresponding terminal pads on said first and second panel-like members.

2. A multi-contact electrical connector as set forth in claim 1 wherein clamping means are provided for clamping said first and second panel-like members to said oppositely directed faces.

3. A multi-contact electrical connector as set forth in claim 2 having conductor supporting means located on said insulating supporting means, said conductor supporting means being located between said planes defined by said oppositely directed faces.

4. A multi-contact electrical connector as set forth in claim 3 wherein said conductor supporting means comprises transverse oppositely directed recesses along one side of said insulating supporting means, the ends of said conductors being inwardly directed towards each other and positioned in said recesses thereby limiting movement of said ends toward each other with said reversely formed conductors being disposed laterally from said one side.

5. A multi-contact electrical connector as set forth in claim 3 wherein said contact terminal has oppositely facing sidewalls, said sidewalls being substantially parallel to each other and extending obliquely with respect to said faces of said supporting means.

6. An electrical connector as set forth in claim 5, said supporting means comprising one side of a rectangular frame member, the remaining three sides being identical to said one side and having contact terminal strips thereon.

7. An electrical connector as set forth in claim 6, said clamping means comprising a second rectangular frame member in surrounding relationship to said rectangular frame member, and means on said second rectangular frame member extending over a substrate positioned in said frame member.

8. An electrical connector as set forth in claim 2 having a second terminal strip, said supporting means having a second side which faces in the opposite direction from said one side, said second terminal strip being mounted on said second side.

9. An electrical connector in combination with first and second panel-like members, said members being in parallel spaced-apart relationship and having first and second terminal pads thereon, said terminal pads being arranged in rows,
   said connector comprising supporting means and a contact terminal strip, said supporting means comprising a bar-like member located between said panel-like members, said supporting means having oppositely directed faces, said panel-like members being against said faces,
   said contact terminal strip comprising a strip of polymeric film having parallel side edges, a plurality of conductors adhered to said film on one surface thereof, said conductors being of conductive metal having spring characteristics and extending in parallel side-by-side relationship across said film, the number of said conductors being equal to the number of terminal pads in each of said rows, said conductors being reversely formed transversely of their lengths through an angle of substantially 180° with respect to an axis extending parallel to said polymeric strip and on the surface thereof which is opposite to said one surface whereby said terminal strip has oppositely facing sidewalls, and said conductors are on the external surface thereof, said bar-like member having one side extending transversely between said panel-like members, said edges of said terminal strip being mounted on said one side whereby said conductors extend laterally from said one side, each of said conductors having first and second contact areas on said first and second sidewalls, said first contact areas being in contact with said first terminal pads and said second contact areas being in contact with said second terminal pads whereby, corresponding terminal pads on said first and second panel-like members are electrically connected to each other.

10. The combination set forth in claim 9, said contact terminal strip being substantially U-shaped.

11. The combination as set forth in claim 10, said sidewalls of said contact terminal strip being substantially parallel to each other and extending obliquely with respect to said faces of said supporting means.

12. The combination set forth in claim 11, said supporting means comprising one side of an open rectangular frame, the remaining three sides being identical to said one side and having contact terminal strips thereon.

13. The combination set forth in claim 12, said clamping means comprising a second open rectangular frame in surrounding relationship to said open rectangular frame, and means on said second open rectangular frame extending over a substrate positioned in said open frame.

14. The combination set forth in claim 10, said side edges of said contact terminal strip being inwardly directed towards each other, said one side of said supporting means having spaced-apart parallel recesses extending therealong, said side edges being received in said recess thereby to mount said terminal strip on said supporting means.

15. The combination set forth in claim 14, said recess extending beside said oppositely directed faces.

16. The combination set forth in claim 10, said contact terminal strip having a web and sidewalls, each of said conductors having first and second contact surfaces for engagement with corresponding first and second terminal pads, one of said contact surfaces being on each of said sidewalls.

17. The combination set forth in claim 10, having a second terminal strip, said mounting means having a second side which faces in the opposite direction from said one side, said second terminal strip being mounted on said second side.

* * * * *